United States Patent
Sakurada

(10) Patent No.: US 7,285,033 B2
(45) Date of Patent: Oct. 23, 2007

(54) COLOR FILTER, DISPLAY DEVICE AND ELECTRONIC EQUIPMENT, MANUFACTURING METHOD THEREOF, AND APPARATUS FOR MANUFACTURING DISPLAY DEVICE

(75) Inventor: Kazuaki Sakurada, Shimosuwa-machi (JP)

(73) Assignee: Seiko Epson Corporation, Tokyo (JP)

( * ) Notice: Subject to any disclaimer, the term of this patent is extended or adjusted under 35 U.S.C. 154(b) by 255 days.

(21) Appl. No.: 10/860,033

(22) Filed: Jun. 4, 2004

(65) Prior Publication Data

US 2004/0224599 A1 Nov. 11, 2004

Related U.S. Application Data

(63) Continuation of application No. 10/157,911, filed on May 31, 2002, now Pat. No. 6,933,086.

(30) Foreign Application Priority Data

Jun. 1, 2001 (JP) .............................. 2001-167485

(51) Int. Cl.
*H01J 9/227* (2006.01)
(52) U.S. Cl. ............................ 445/24; 427/64; 427/66; 347/107
(58) Field of Classification Search ...................... None
See application file for complete search history.

(56) References Cited

U.S. PATENT DOCUMENTS

| 5,951,350 | A | 9/1999 | Aoki et al. |
| 6,135,841 | A | 10/2000 | Mackey |
| 6,657,687 | B2 | 12/2003 | Takizawa |

FOREIGN PATENT DOCUMENTS

| EP | 0 978 737 A1 | 2/2000 |
| GB | 2 356 713 A * | 5/2001 |
| JP | A 6-230364 | 8/1994 |
| JP | A 7-191211 | 7/1995 |
| JP | A 10-96811 | 4/1998 |
| JP | A 2000-180841 | 6/2000 |
| JP | A 2000-347179 | 12/2000 |
| JP | A 2001-130141 | 5/2001 |

* cited by examiner

*Primary Examiner*—John A. McPherson
(74) *Attorney, Agent, or Firm*—Oliff & Berridge, PLC

(57) ABSTRACT

In a manufacturing method of a color filter for display devices having a plurality of pixels on a substrate, each pixel comprises a reflective layer and a color layer, the method of manufacture comprises a step of forming partitions which separate each pixel area from the other pixel areas to comprise the pixel in each pixel area; a step of forming the reflective layer by discharging a first liquid material into each of the pixel areas by means of a droplet discharge method; and a step of forming the color layer within each of the pixel areas. By this method, color filters can be manufactured without requiring photolithography or other complicated processes, in a short time, using little energy, and at low cost.

2 Claims, 7 Drawing Sheets

(a)

(b)

(c)

COLOR FILTER, DISPLAY DEVICE AND ELECTRONIC EQUIPMENT, MANUFACTURING METHOD THEREOF, AND APPARATUS FOR MANUFACTURING DISPLAY DEVICE

This is a Continuation of application Ser. No. 10/157,911 filed May 31, 2002, now U.S. Pat. No. 6,933,086. The entire disclosure of the prior application is hereby incorporated by reference herein in its entirety.

TECHNICAL FIELD

This invention relates to a method and apparatus for the manufacture of a color filter used in reflective color liquid crystal display devices and other devices. This invention also relates to a method of manufacture of display devices and electronic equipment comprising the color filter, and to a color filter.

BACKGROUND ART

In recent years technology has been developed for reflective type display devices, which efficiently utilize ambient light to enable the display of images even without a backlight; such displays are thin, lightweight, and have low power consumption. Such reflective type displays comprise a color filter in which reflective layers and color layers are formed in sequence on a substrate.

Also, semi-transmissive display devices, in which the reflective layer is formed as a semi-transmissive layer having optical transmissive properties, have also been developed. Such semi-transmissive display devices can be used as reflective type devices in bright environments, utilizing ambient light, and can be used as transmissive type display devices in dark environments, using a backlight.

As a method to form the reflective layer, conventionally, sputtering or vacuum evaporation methods have been used to deposit an aluminum alloy or silver alloy.

In Japanese Patent Publication No. H7-191211, a high-reflectivity conductive film and a transparent conductive film are stacked on a substrate, using the conductive film and photoconductive film, a coloring pattern is formed by means of an electro-photographic method, and the conductive film is used as a reflective layer.

Also, in Japanese Patent Publication No. H10-96811, at least three coloring layers each having different colors are formed on a substrate, enclosing a reflective layer between the substrate and the coloring layers. The upper portion of the coloring layers is evaporated by means of laser irradiation, and the lower portion of the coloring layers is exposed, to form a reflective type color filter.

In conventional methods which employ sputtering or vacuum evaporation techniques to form reflective layers, at least four photolithography processes are required to reach the stages of substrate surface treatment and coloring layer formation, thus incurring a large number of processes and considerable time, and causing decreases in production yields.

In the method in the above-noted Japanese Patent Publication No. H7-191211, the number of processes for coloring layer formation is less than for photolithography, but a photomask is required for formation of each coloring layer and of the black matrix, and vacuum evaporation equipment, corona charge equipment and other equipment are separately required. Also, because only electrically insulating material can be used as toner, further constraints are imposed.

In the method in the above-noted Japanese Patent Publication No. H10-96811, a photomask is not required, but the upper coloring layer may be affected by the lower coloring layer. And, because laser light is used for evaporation, fine patterning is difficult. Also, surface unevenness of approximately 3 µm occurs on the substrate processed surface, so that brightness irregularities due to the difference in thickness of the liquid crystal layer readily occur.

An object of this invention is to provide a method enabling the manufacture of a reflective type color filter and display device in a short time, using little energy and at low cost, without requiring photolithography or other complicated processes.

DISCLOSURE OF THE INVENTION

In order to resolve the above-mentioned problem, this invention provides a manufacturing method of a color filter having a plurality of pixels on a substrate, each pixel comprising a reflective layer and a color layer. The method comprises: a step of forming partitions which separate each pixel area, each comprising each pixel, from the other pixel areas; a step of forming the reflective layer by discharging a first liquid material into each of the pixel areas by means of a droplet discharge method; and a step of forming the color layer within each of the pixel areas.

In the above-mentioned manufacturing method, it is desirable that the step of forming the color layer comprises a step of discharging a second liquid material by means of a droplet discharge method.

In the above-mentioned manufacturing method, the reflective layer may be a semi-transmissive reflective layer having light-transmitting properties. In the above-mentioned manufacturing method, it is desirable that the first liquid material comprises light-scattering material. In the above-mentioned manufacturing method, it is desirable that a step be further comprised to form a light scattering layer between the reflective layer and the color layer.

In the above-mentioned manufacturing method, the partitions, the reflective layer, and the color layer may be formed integrally on an active matrix substrate.

A manufacturing method of a display device of this invention uses a color filter manufactured by the above-mentioned method. Also, a manufacturing method of a display device of this invention comprises: a step of forming a reflective layer by a droplet discharge method; and a step of forming an electroluminescence element on the reflective layer.

A manufacturing method of electronic equipment of this invention uses a display device manufactured by the above-mentioned method.

This invention also relates to apparatus for manufacturing a display device having a reflective layer on a substrate. The apparatus comprises a discharge portion to discharge, onto a substrate, a liquid material to form the reflective layer, by means of a droplet discharge method.

A color filter of this invention comprises a plurality of pixels on a substrate, each pixel comprises a reflective layer and a color layer. The color filter comprises partitions which separate each pixel area from the other pixel areas; each pixel area comprises each pixel. The reflective layer and the color layer of each pixel are separated from the reflective layers and color layers of other pixels by the partitions.

A display device of this invention comprises the above-mentioned color filter, and electronic equipment of this invention comprises the above-mentioned display device.

Figure 1:
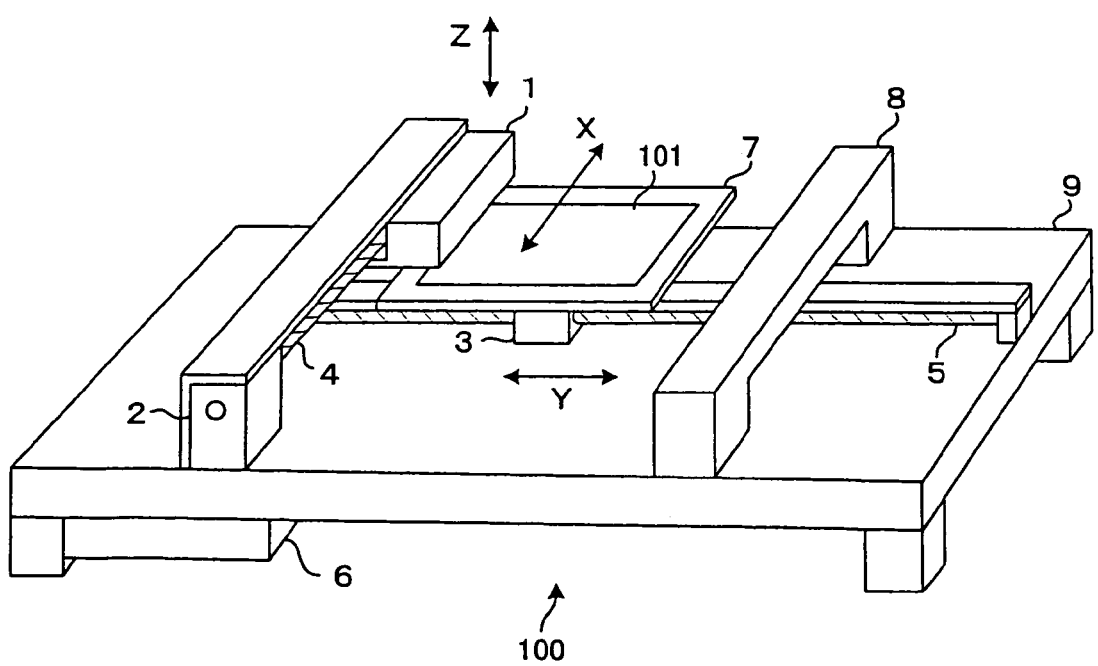
FIG. 1 shows a schematic perspective view of manufacturing apparatus of an aspect of this invention.

In these figures, the symbol 100 denotes manufacturing apparatus, 200 and 500 are color filters, and 300 is a color liquid crystal display device (display device).

BEST MODE FOR CARRYING OUT THE INVENTION

Below, embodiments of this invention are explained, referring to the drawings.

1. Configuration Of Manufacturing Apparatus

FIG. 1 shows a schematic perspective view of manufacturing apparatus of an aspect of this invention. As shown in the figure, the manufacturing apparatus 100 comprises an ink jet head group 1; an X-direction driving shaft 4; a Y-direction guide shaft 5; a control device 6; a carriage 7; a cleaning mechanism 8; and a base 9.

The ink jet head group 1 comprises a plurality of ink jet heads (described below) which discharge ink of a prescribed color from a nozzle (discharge outlet) to apply the ink to a color filter substrate 101.

The carriage 7 carries the color filter substrate 101 to which ink is applied by this manufacturing apparatus, and so comprises a mechanism to fix the substrate 101 in a reference position.

The X-direction driving shaft 4 is connected to an X-direction driving motor 2. The X-direction driving motor 2 is a stepping motor; when X-axis direction driving signals are supplied from the control device 6, the X-direction driving shaft 4 is made to rotate. When the X-direction driving shaft 4 is made to rotate, the ink jet head group 1 moves in the X-axis direction.

The Y-direction guide shaft 5 is fixed so as not to move with respect to the base 9. The carriage 7 comprises a Y-direction driving motor 3. The Y-direction driving motor 3 is a stepping motor; when Y-axis direction driving signals are supplied from the control device 6, the carriage 7 is made to move in the Y-axis direction.

The control circuit 6 supplies a voltage for control of the discharge of ink droplets to each head of the ink jet head group 1. Driving pulse signals to control the motion in the X-axis direction of the ink jet head group 1 are supplied to the X-direction driving motor 2, and driving pulse signals to control the motion in the Y-axis direction of the carriage 7 are supplied to the Y-direction driving motor 3.

The cleaning mechanism 8 comprises a mechanism to clean the ink jet head group 1. The cleaning mechanism 8 comprises a Y-direction driving motor, not shown. By means of driving by this Y-direction driving motor, the cleaning mechanism 8 moves along the Y-direction guide shaft 5. Motion of the cleaning mechanism 8 is also controlled by the control device 6.

2. Color Filter Configuration

Figure 2:
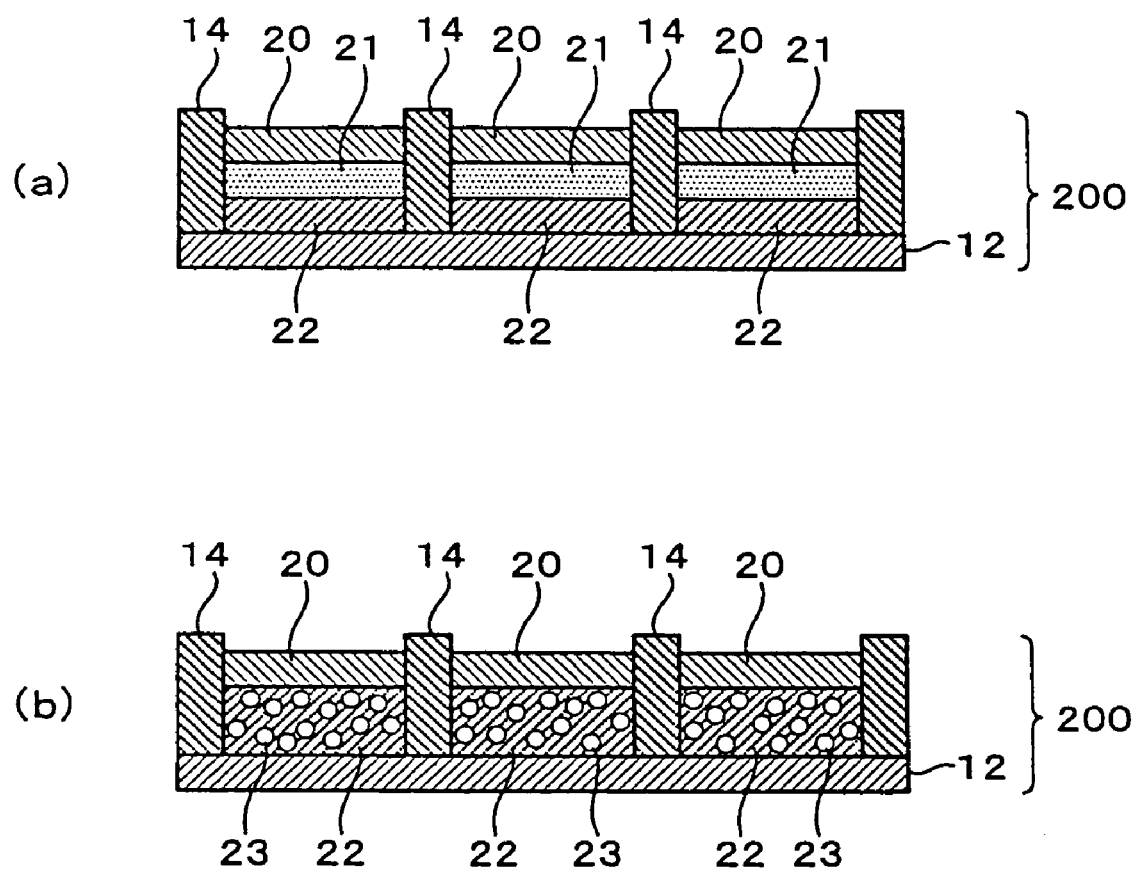
FIG. 2 shows partial cross-sectional views of color filters manufactured using the manufacturing apparatus and the manufacturing method of an aspect of this invention.

FIG. 2 shows partial cross-sectional views of color filters manufactured by the manufacturing apparatus and the manufacturing method of an aspect of this invention. FIG. 2(*a*) shows a first embodiment, and FIG. 2(*b*) shows a second embodiment.

The color filter 200 comprises pixels arranged in a matrix on a substrate 12; boundaries between the pixels are delineated by light-shielding partitions 14. Into each of the pixels is introduced an ink in one of the colors red (R), green (G), and blue (B). The positioning of the red, green and blue may be in a so-called mosaic array, stripe array, delta array, or in some other arrangement.

In the first embodiment shown in FIG. 2(*a*), a reflective layer 22, a scattering layer 21, and a color layer 20 are stacked in each portion where partitions 14 are not formed (have been removed) on the substrate 12. The reflective layer 22 may be of silver, aluminum, or a silver or aluminum alloy, or similar. The reflective layer may be a material not having light-transmitting properties, or a semi-transmissive reflecting layer of a material having light-transmitting properties. The scattering layer is of mica coated with $TiO_2$ or some other metal oxide that has functions to scatter light to enhance scattering characteristics of the layer. The reflective characteristics and the scattering characteristics of the reflective layer and the scattering layer may be changed for each of the RGB colors to adjust the color balance. An overcoat layer or similar, not shown, is formed on the upper surface of the partitions 14 and the color layer 20.

In the second embodiment shown in FIG. 2(*b*), the reflective layer 22 and the color layer 20 are stacked in the portion where the partitions 14 are not formed on the substrate 12. In particular, in this embodiment, the reflective layer 22 comprises beads 23 of alumina, titania or similar, approximately spherical in shape. These beads endow the surface shape of the reflective layer with roughness, cause light to be scattered, and enhance the scattering characteristics of the reflective layer 22. It is desirable that the diameters of the beads be in the range from submicron sizes to several microns in size.

3. Color Filter Manufacturing Method

Figure 3:
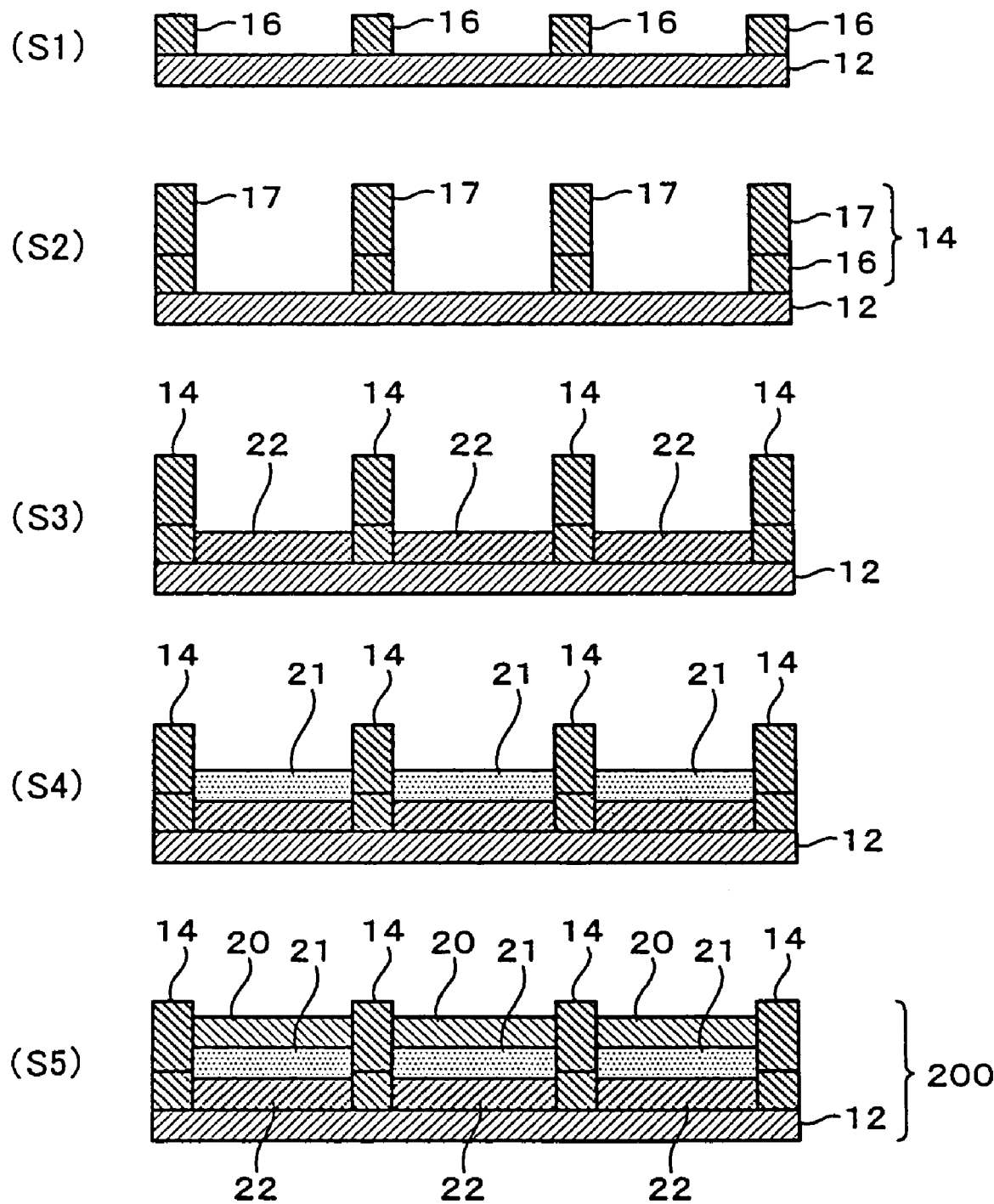
FIG. 3 shows a cross-sectional view of manufacturing processes, explaining a method for manufacturing color filters of a first embodiment.

FIG. 3 shows a cross-sectional view of manufacturing processes, explaining a method for manufacturing color filters of the first embodiment.

3-1. Partition Formation Process

The surface of a transparent substrate 12 of non-alkaline glass, measuring 47 cm high, 37 cm wide, and 0.7 mm thick, is cleaned with a cleaning solution of heated concentrated sulfuric acid with 1 weight percent hydrogen peroxide added; after rinsing with pure water and air-drying, a clean surface is obtained. Onto this surface is formed by sputtering a chromium metal film layer of average film thickness 0.2 μm).

This substrate is dried for five minutes at 80° C. on a hot plate, and then spin-coating is used to form a photoresist layer on the surface of the metal layer. A mask film on which is drawn a prescribed matrix pattern is brought into close contact with this substrate surface, and exposure to ultraviolet rays is performed. Next, this is immersed in an alkaline developing solution containing 8 weight percent potassium hydroxide, and the photoresist of the unexposed portions is removed, to pattern the resist layer. Then, the exposed metal layer is removed by etching using an etching solution, the principal component of which is hydrochloric acid. In this way, a shielding layer (black matrix) 16 having a prescribed matrix pattern is obtained (S1 in FIG. 3).

A negative-type acrylic photosensitive resin composition is then applied by spin-coating onto the substrate. This is pre-baked for 20 minutes at 100° C., and then subjected to ultraviolet ray exposure using a mask film on which is drawn a prescribed matrix pattern. The resin of the unexposed portions is developed using an alkaline developing solution, and after rinsing with pure water, spin-drying is performed. As a final drying process, final baking is performed for 30 minutes at 200° C., and by sufficiently hardening the resin portion, a bank layer 17 is formed, to complete the partitions 14 comprising the shielding layer 16 and the bank layer 17 (S2 in FIG. 3).

3-2. Reflective Layer And Scattering Layer Formation Process

Next, an Ag colloidal disperse solution is applied to all the pixel areas delineated and formed by the partitions 14 using a droplet discharge method, in particular an ink jet method. As the ink jet heads, precision heads employing the piezoelectric effect are used, to discharge, for example, ten minute droplets into each pixel area. After application, drying by baking is performed, to form the reflective layer 22 (S3 in FIG. 3).

In the method of manufacture of a color filter of the first embodiment (FIG. 2(*a*)), an Ag colloidal disperse solution is applied and drying and baking thereof are performed; and then, a disperse solution having as the dispersant white mica coated with $TiO_2$, $Fe_2O_3$, or some other metal oxide, is applied to all the pixel areas by the ink jet method. After that, baking and drying are performed, to form the scattering layer 21 (S4 in FIG. 3).

In the method of manufacture of a color filter of the second embodiment (FIG. 2(*b*)), prior to application of the Ag colloidal disperse solution to form the reflective layer, beads of alumina, titania or similar are introduced by the ink jet method or similar into each pixel area. By this means, when the Ag colloidal disperse solution is discharged by the ink jet method and baked, the reflective layer 22 is formed to have scattering properties by a roughness of its surface caused by the beads. Or, the beads can be included in the Ag colloidal disperse solution in advance, and discharged by the ink jet method. Or, the beads can be added to the pixel areas after ink jet discharge of the Ag colloidal disperse solution. In this second embodiment, a scattering layer 21 is not formed (S4).

3-3. Ink Introduction Process

Next, the method of droplet discharge, in particular the ink jet method, is used to introduce a first ink (red), a second ink (green), and a third ink (blue) onto the reflective layer 22 or scattering layer 21. The inks in the three colors red, green, and blue are applied simultaneously according to a program, the conditions of which are set in advance to form a prescribed color pattern.

As the inks, for example, after dispersing an inorganic pigment in a polyurethane resin oligomer, cyclohexane and butyl acetate are added as low-boiling-point solvents, or butyl carbitol acetate is added as a high-boiling-point solvent, 0.01 weight percent of a non-ionic surfactant is added as a dispersant, and the viscosity is adjusted to between 6 and 8 centipoise.

Next, the applied ink is dried. First, the ink layer is made to set by being left in a natural environment for three hours, after which the ink layer is heated for 40 minutes at 80° C. on a hot plate, and finally is heated for 30 minutes at 200° C. in an oven to perform hardening, thereby obtaining the color layer 20 (S5 in FIG. 3).

4. Display Device Configuration

Figure 4:
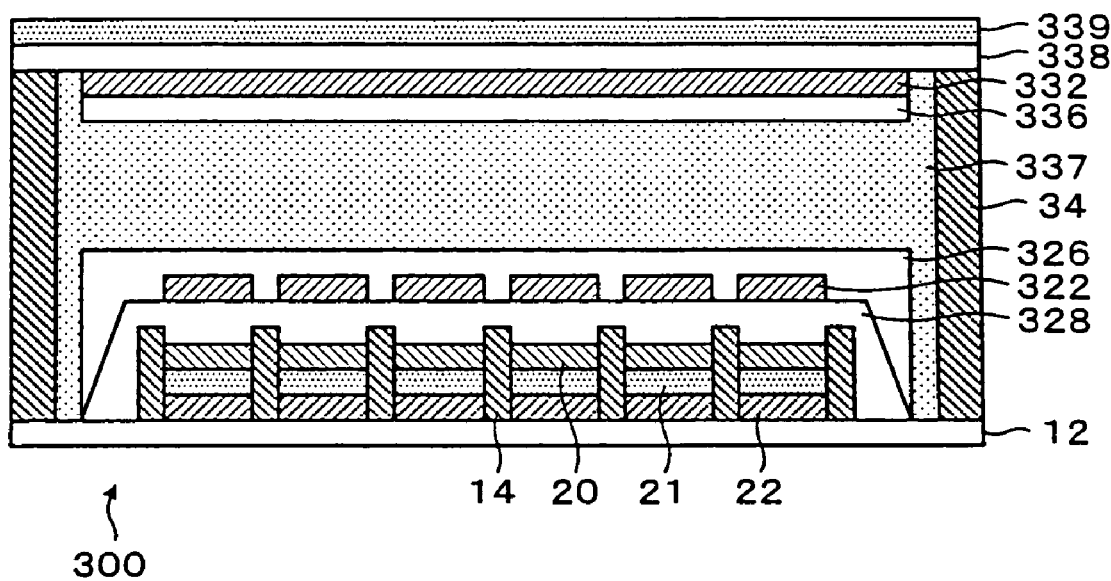
FIG. 4 shows a cross-sectional view of a color liquid crystal display device, manufactured using a color filter manufactured by a manufacturing method of this invention.

FIG. 4 is a cross-sectional view of a color liquid crystal display device. This color liquid crystal display device 300 is manufactured using the color filter 200 manufactured by the method of the above-mentioned embodiments, so that photolithography and other complicated processes are unnecessary, and manufacturing in a short time, using little energy and at low cost, is possible.

This color liquid crystal display device 300 is configured by bonding together a color filter 200 and an opposing substrate 338, and sealing a liquid crystal composition 337 between the two substrates. A liquid crystal sealant 34 is formed on the periphery of the display device. An overcoat layer 328 is formed on the color layer 20 of the color filter; on the overcoat layer 328 are formed pixel electrodes 322 corresponding to each color layer of the color filter. A common electrode 332 is also formed on the face of the opposing electrode 338 facing the color filter; depending on the mode of operation, TFTs or other switching devices may be fabricated.

Alignment films 326, 336 are formed on the opposing surfaces of the color filter 200 and the opposing substrate 338. These alignment films 326, 336 are subjected to rubbing treatment, causing the liquid crystal molecules to be aligned in a fixed direction. A polarizer 339 is bonded to the outer face of the opposing substrate 338. When the reflective layer 22 is formed as a semi-transmissive layer having semi-transmissive properties, a polarizer (not shown) is also bonded to the side of the substrate 12 of the color filter.

In a reflective-type liquid crystal display device 300 fabricated in this way, the amount of transmission of light incident from the side of the opposing substrate 338 is controlled by means of voltages applied to the liquid crystals 337, to display a desired image. In a semi-transmissive liquid crystal display device having a reflective layer 22 with semi-transmissive properties, light incident from the side of the opposing substrate 338 is used in a bright environment, and light from a backlight provided on the side of the color filter 200 is used in a dark environment, with the amount of transmission of light controlled by the liquid crystals 337 to display a desired image.

Display devices of this invention are not limited to the above-mentioned color liquid crystal display device, but may be display devices which use other elements to control the amount of light transmission; for example, display devices using photo-chromic elements or electro-chromic elements.

5. Color Filter on an Active Matrix Substrate

Figure 5:
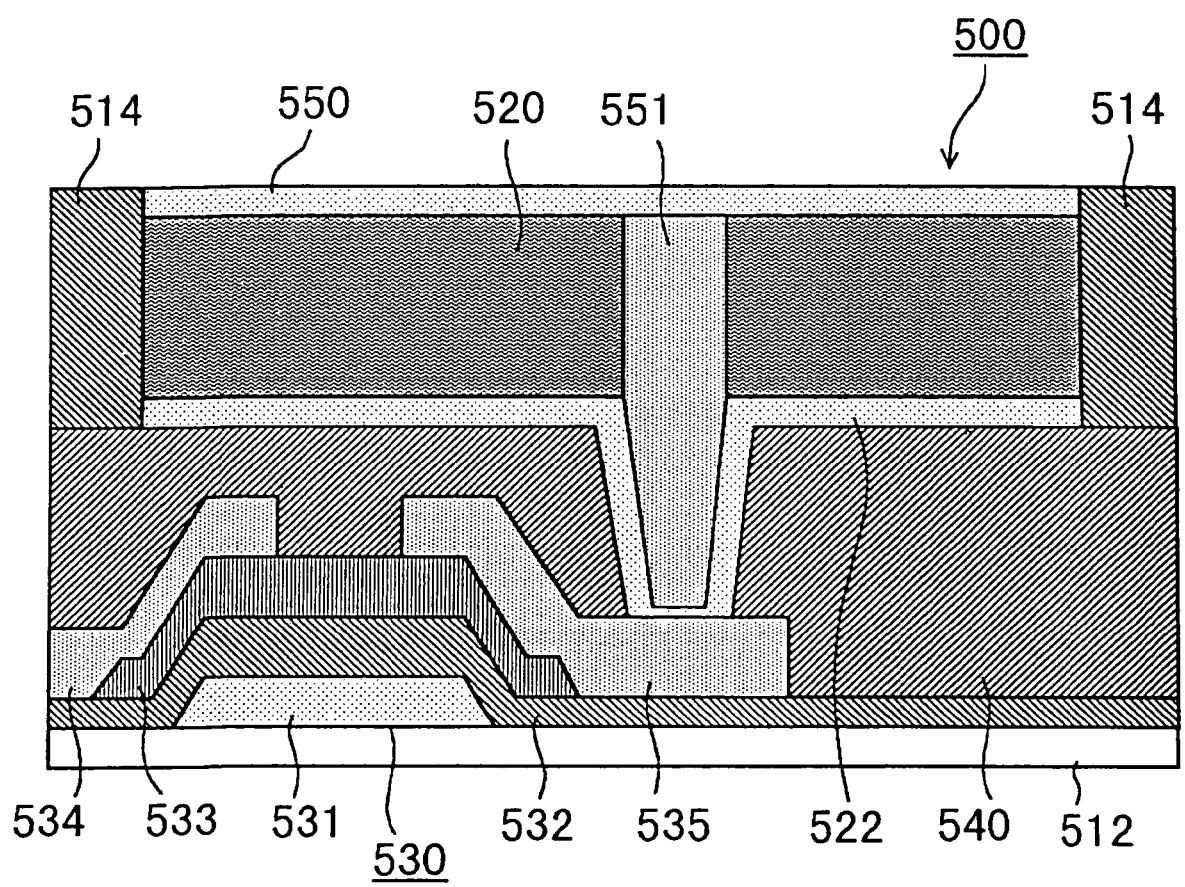
FIG. 5 shows a cross-sectional view of the principal parts of a variation of the color filter.

FIG. 5 is a cross-sectional view of the principal parts of a variation of the color filter. This color filter 500 comprises TFTs (thin film transistors) 530 or other active elements formed in a matrix on a substrate 512. A substrate on which active elements are formed in a matrix is called an active matrix substrate. On these TFTs 530 is formed an insulation film 540, and on the insulation film 540, partitions 514, a reflective layer 522, and a color layer 520 are formed integrally. Such a color filter with the color layer and similar formed on top of the TFTs is called a "CF on TFT" (color filter on TFTs). The active elements are not limited to TFTs, but may be TFDs (thin film diodes) or some other element.

Each of the TFTs 530 comprises a gate electrode 531, which applies a signal voltage to the gate insulation film 532; a silicon film 533, formed on top of the gate insulation film 532; and a source electrode 534 and drain electrode 535, which pass current via a channel formed in the silicon film 533 as a result of the signal voltage. These TFTs 530 have a so-called reverse-staggered structure, but some other structure is also possible.

Partitions 514 to divide the pixels are formed directly on the insulation film 540. In each pixel is formed a reflective layer 522 directly on the insulation film 540; the color layer 520 and a pixel electrode 550 are stacked in this order on the reflective layer 522. The pixel electrode 550 is formed from ITO or some other transparent material. In order to enable conduction between the drain electrode 535 of the TFT 530 and the pixel electrode 550, a through-hole is formed penetrating the insulation film 540 and the color layer 520; this through-hole is packed with a conductive material 551.

Next, an example of a method of manufacture of this color filter 500 is briefly explained. First, a gate electrode 531 and a signal line, not shown, connected to the gate electrodes 531, are formed on the upper face of a substrate 512 of glass or some other material, by patterning of metal or some other conductive material. On the entire upper surface of the substrate 512 on which are formed such gate electrode 531 or other conductive material, silicon nitride or other gate insulation film 532 is formed. On the gate insulation film 532, an amorphous silicon layer is formed, and this is patterned in a prescribed shape to form the silicon film 533. Finally, by forming the source electrode 534 and the drain electrode 535 at prescribed positions on the silicon film 533 and the gate insulation film 532, the TFT 530 is fabricated.

Next, an insulation film 540 covering the entire TFT 530 is formed using, for example, a polyimide resin. It is desirable that the upper face of the insulation film 540 be as flat as possible, in order to improve the quality of the reflective layer 522 formed later.

The partitions 514 dividing the pixels are formed in a prescribed shape on the insulation film 540. As the material of the partitions 514, for example, a fluoride resin may be used. Then, photolithography is for example used to form a through-hole in the insulation film 540, connecting with the drain electrode 535.

Next, a liquid containing a material to become the reflective layer 522, for example a silver colloidal solution, is discharged by a droplet discharge method, and in particular by an ink jet method, into each of the pixel areas divided by the partitions 514. The liquid introduced into each of the pixel areas is dried and baked to become the reflective layer 522. This reflective layer 522 may be endowed with properties for scattering light as well. A scattering layer, not shown, may also be provided on the reflective layer 522.

Then, a liquid containing the material to become the color layer 520, in particular an ink, is discharged by a droplet discharge method, in particular by an ink jet method into each of the pixel areas. By again performing drying and baking, a color layer is formed.

Next, the same photomask employed when forming the through-holes in the insulation film 540 is used to perform etching of the color layer 520, forming through-holes in the color layer 520 in the same positions as the through-holes provided in the insulation film 540. These through-holes are then packed with a conductive material 551. By then forming pixel electrodes 550 of a transparent material in the pixels formed by the color layer 520 and the conductive material 551, the color filter of this embodiment is completed.

When it is possible to use a single process to perform all the etching of the color layer 520, the reflective layer 522 and the insulation film 540, after these layers have been fabricated, a through-hole to the drain electrode may be formed all at once.

In this embodiment, the reflective layer 522 is of silver, which is a conductive material. Hence in order to secure conduction between the drain electrodes 535 and the reflective layer 522, and conduction between the reflective layer 522 and the pixel electrodes 550, the through-holes formed in the insulation film 540 and in the color layer 520 need not be in the same positions.

6. Electroluminescence Display Devices

Figure 6:
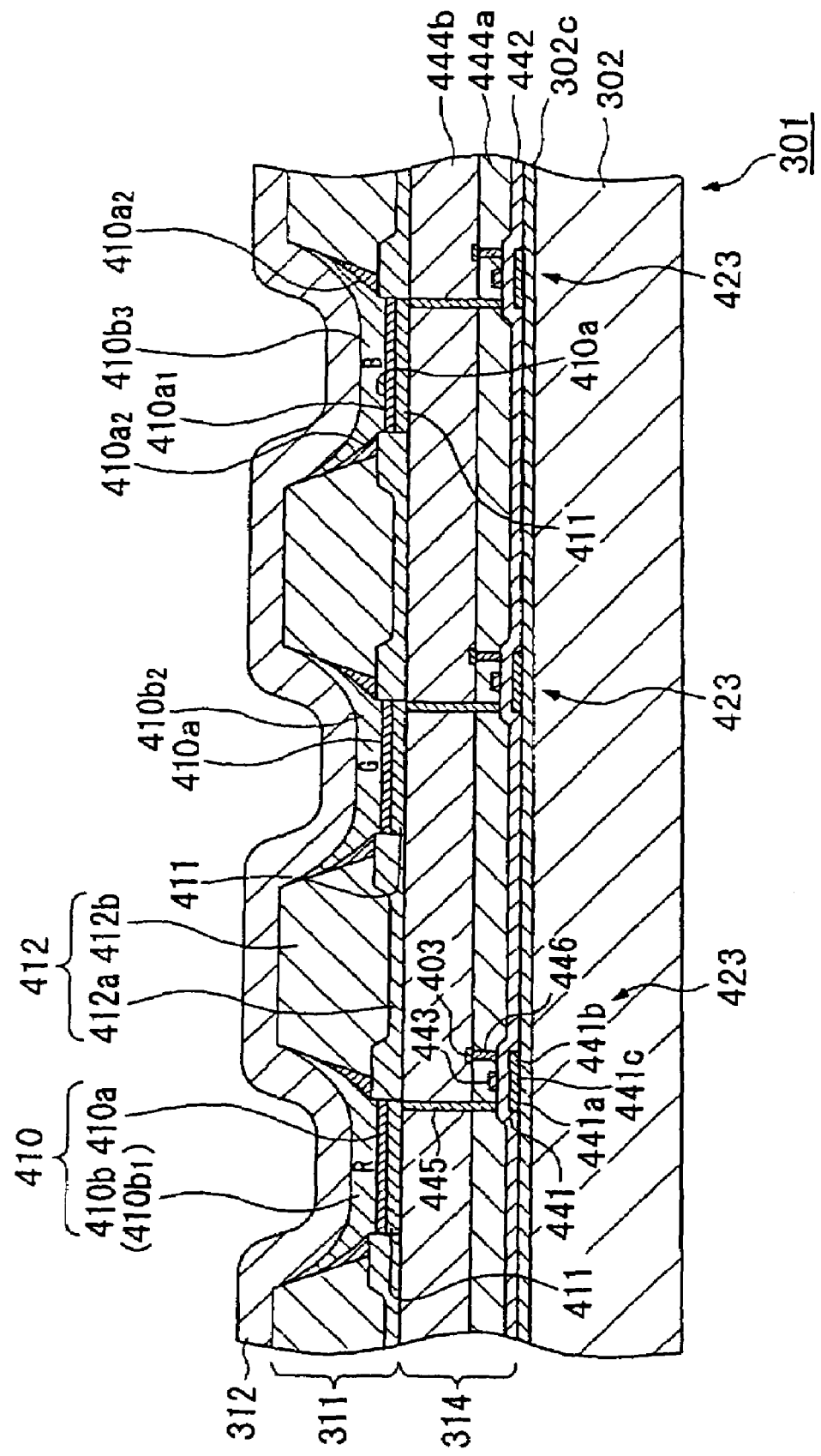
FIG. 6 shows a cross-sectional view of the principal parts of an electroluminescence display device, among the display devices of this invention; and, FIG. 7 shows perspective views for examples of the electronic equipment of this invention.

FIG. 6 shows a cross-sectional view of the principal parts of an electroluminescence display device, among the display devices of this invention. In FIG. 6, three pixels are shown. The display device 301 is configured by the stacking on a substrate 302 in sequence of a circuit element portion 314, in which are formed TFTs or other circuits, and a light-emitting element portion 311, in which are formed functional layers 410.

This display device is configured as a so-called top-emission device. That is, light emitted from the functional layer 410 to the side of the cathode 312 is transmitted through the cathode 312 and emitted to the upper side of the cathode 312. Also, light emitted from the functional layer 410 to the side of the substrate 302 is reflected by the pixel electrodes 411, passes through the cathode 312, and is emitted to the upper side of the cathode 312.

6-1. Circuit Element Portion

To fabricate the circuit element portion 314, first a base protective film 302c of silicon oxide is formed on the substrate 302. On this base protective film 302c is formed an island-shape semiconductor film of polycrystalline silicon. A source area 441a and a drain area 441b are formed by implantation of P ions at high densities into the semiconductor film 441. Areas into which P is not introduced become channel areas 441c.

Next, in the circuit element portion 314, a transparent gate insulation film 442 covering the base protective film 302c and the semiconductor film 441 is formed, and on a gate insulation film 442 are formed gate electrodes 443 (scan lines). A transparent first interlayer insulation film 444a and a second interlayer insulation film 444b are formed on the gate electrodes 443 and the gate insulation film 442. The gate electrodes 443 are provided in positions corresponding to the channel areas 441c of the semiconductor film 441.

Contact holes 445, 446, penetrating the first and second interlayer insulation films 444a, 444b, and connecting to the source and drain areas 441a, 441b respectively, are then formed.

Next, pixel electrodes 411 are formed of a highly reflective material on the second interlayer insulation film 444b, with a prescribed pattern, and the first contact hole 445 is connected with this pixel electrode 411.

The other contact hole 446 is connected to the power supply line 403.

In this way, thin film transistors 423 connected to each of the pixel electrodes 411 are formed in the circuit element portion 314.

6-2. Light-Emitting Element Portion

The light-emitting element portion 311 principally comprises a functional layer 410, layered on each of a plurality of pixel electrodes 411; partitions 412, dividing each pixel electrode 411 and functional layer 410 from the adjacent pixel electrode 411 and the adjacent functional layer 410; and a cathode 312 formed on top of the functional layer 410. Light-emitting elements are formed from these pixel electrodes (first electrodes) 411, functional layer 410, and cathode 312 (opposing electrode).

The pixel electrode 411 is formed into substantially a rectangular shape as shown in a top view. It is desirable that the length of the pixel electrode 411 be in the range 50 nm to 200 nm, and in particular a length of approximately 150 nm is preferable. Because the pixel electrode 411 is here used as an anode, a metal material with high work function and good reflectivity, such as Cr, Fe, Co, Ni, Cu, Ta, W, or Au, is used. The pixel electrodes 411 can be obtained by discharging a liquid containing a highly reflective metal material such as the above into each of the pixel areas divided by the partitions 412 using a droplet discharge method, in particular an ink jet method, followed by drying and baking.

The partitions 412 are formed by layering an inorganic bank layer 412a (first bank layer), positioned near the substrate 302, and an organic bank layer 412b (second bank layer), positioned at a distance from the substrate 302.

It is desirable that the inorganic bank layer 412a be of, for example, $SiO_2$, $TiO_2$, or some other inorganic material. As the thickness of this inorganic bank layer 412a, the range 50 nm to 200 nm is desirable, and approximately 150 nm is particularly desirable.

The organic bank layer 412b is formed from an acrylic resin, polyimide resin, or other material with heat resistance and resistance to solvents. It is desirable that the thickness of this organic bank layer 412b be in the range 0.1 µm to 3.5 µm, and in particular a thickness of approximately 2 µm is preferable.

6-3. Functional Layer

The functional layer 410 comprises a positive hole injection/transport layer 410a layered on top of the pixel electrodes 411, and a light-emission layer 410b formed on and next to the positive hole injection/transport layer 410a.

The positive hole injection/transport layer 410a has a function for injecting positive holes into the light-emission layer 410b, and also has a function for transporting positive holes in the interior of the positive hole injection/transport layer 410a. By providing the positive hole injection/transport layer 410a between the pixel electrodes 411 and the light-emission layer 410b, the light-emission efficiency, lifetime, and other element characteristics of the light-emission layer 410b are improved. In the light-emission layer 410b, positive holes injected from the positive hole injection/transport layer 410a recombine in the light-emission layer with electrons injected from the cathode 312, to obtain light emission. In addition to the flat portions $410a_1$ on the pixel electrodes 411, the positive hole injection/transport layer 410a may also have a peripheral portion $410a_2$ formed along the partitions 412.

There are three types of light-emission layer 410b: a red light-emission layer $410b_1$, emitting red light; a green light-emission layer $410b_2$, emitting green light; and a blue light-emission layer $410b_3$, emitting blue light. These are arranged, for example, in a stripe array.

6-4. Cathode

The cathode 312 is formed over the entire surface of the light-emission element portion 311. The cathode is paired with the pixel electrodes 411 to play the role of passing a current to the functional layer 410. This cathode 312 comprises, for example, ITO or some other transparent conductor. Here, it is desirable that a material with a low work function be provided in the cathode on the side near the light-emission layer.

A protective film is formed on the cathode 312. In order to obtain uniform light emission characteristics, it is desirable that the upper surface of the protective film be flat.

7. Configuration of Electronic Equipment

Next, specific examples of electronic equipment comprising the above-mentioned display devices are explained. This electronic equipment uses any one of the display devices of the above-mentioned embodiments as display units, so that photolithography and other complicated processes are unnecessary, and manufacturing in a short time, using little energy and at low cost, is possible.

Figure 7:
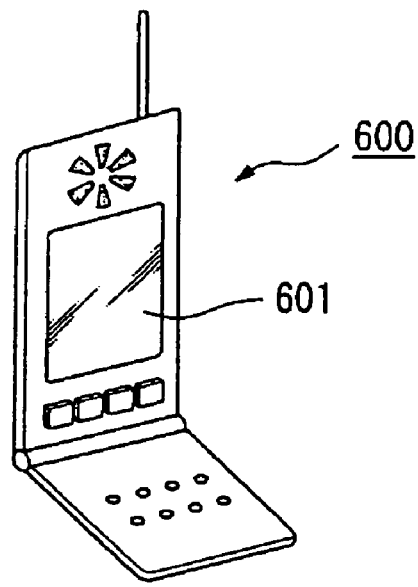
Figure 7:
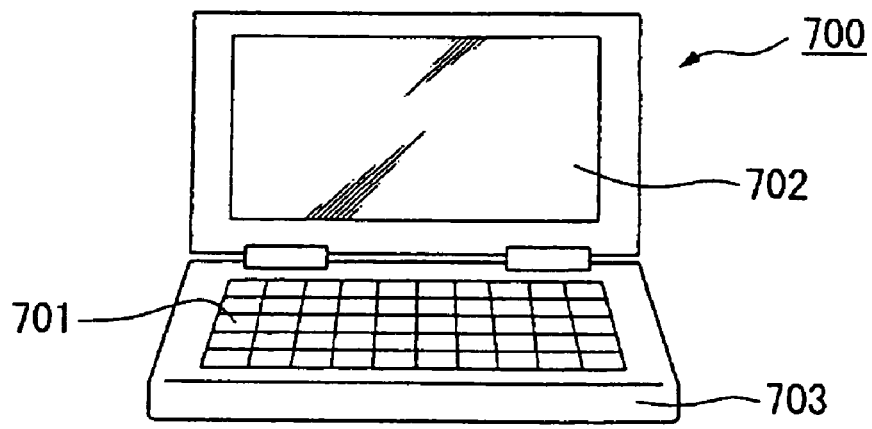
Figure 7:
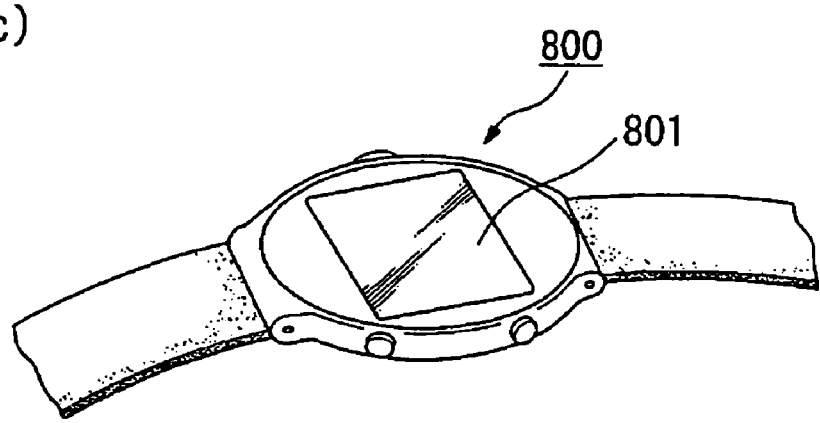

FIG. 7(a) is a perspective view showing an example of a portable telephone. The symbol 600 indicates a portable telephone set, and the symbol 601 indicates a display unit using one of the above-mentioned display devices.

FIG. 7(b) is a perspective view showing an example of a word processor, notebook computer, or other portable information processing equipment.

As shown in the figures, a display unit 702 using one of the above-mentioned display devices is provided in the information processing equipment 700. The information processing equipment 700 also comprises a keyboard or other input unit 701.

This information processing equipment 700 comprises an information processing equipment main unit 703, which in turn comprises a display signal generation portion. The display signal generation portion comprises various circuits such as a display information processing circuit and a clock generation circuit, as well as a power supply circuit to supply electric power to the above-stated various circuits. In the display device, display images are formed by supplying display signals generated by the display signal generation portion, based on information input for example from the input unit 701.

FIG. 7(c) is a perspective view showing one example of wristwatch-type electronic equipment. The symbol 800 indicates the watch main unit, and the symbol 801 indicates the display portion, using one of the above-mentioned display devices.

In order to manufacture this electronic equipment, a display device comprising a driver IC (driving circuit) is fabricated, and this display device is incorporated into the portable telephone, portable type information processing equipment, or wristwatch type electronic equipment.

Electronic equipment incorporating a display device of one of the above-mentioned embodiments is not limited to the above, but includes various types of electronic equipment, such as portable telephone sets, electronic organizers, pagers, POS terminals, IC cards, mini-disc players, liquid crystal projectors, engineering workstations, word processors, television sets, viewfinder-type or monitor direct-view type videotape recorders, electronic calculators, car navigation equipment, devices comprising touch-screen panels, watches, and game equipment.

INDUSTRIAL APPLICABILITY

By means of this invention, a method is provided enabling the manufacture of color filters without requiring photolithography or other complicated processes, in a short time, using little energy, and at low cost.

What is claimed is:

1. A manufacturing method of a display device, comprising:
    forming, above a substrate, a pixel electrode out of a highly reflective material by a droplet discharge method;
    forming a light-emitting element above the pixel electrode after forming the pixel electrode; and
    forming a transparent cathode above the light-emitting element, after forming the light-emitting element.

2. A manufacturing method of electronic equipment by using a display device manufactured by a method according to claim 1.

* * * * *